(12) United States Patent
Ma et al.

(10) Patent No.: US 6,309,932 B1
(45) Date of Patent: Oct. 30, 2001

(54) PROCESS FOR FORMING A PLASMA NITRIDE FILM SUITABLE FOR GATE DIELECTRIC APPLICATION IN SUB-0.25 $\mu$M TECHNOLOGIES

(75) Inventors: Yi Ma; Pradip K. Roy, both of Orlando, FL (US)

(73) Assignee: Agere Systems Guardian Corp, Allentown, PA (US)

( * ) Notice: Subject to any disclaimer, the term of this patent is extended or adjusted under 35 U.S.C. 154(b) by 0 days.

(21) Appl. No.: 09/334,491

(22) Filed: Jun. 16, 1999

Related U.S. Application Data
(60) Provisional application No. 60/116,042, filed on Jan. 14, 1999.

(51) Int. Cl.[7] .......................... H01L 21/336; H01L 21/31
(52) U.S. Cl. ......................... 438/287; 438/787; 438/791
(58) Field of Search ..................... 438/287, 787, 438/791

(56) References Cited

U.S. PATENT DOCUMENTS 6,143,608 * 11/2000 He et al. ........................ 428/264

* cited by examiner

Primary Examiner—John F. Niebling
Assistant Examiner—Alexander G. Ghyka
(74) Attorney, Agent, or Firm—Christie, Parker & Hale, LLP

(57) ABSTRACT

A process for forming a layered gate dielectric structure which suppresses boron diffusion and provides a gate dielectric structure which is resistant to charge trapping, pinhole-free, and which does not introduce mobility or drive current problems. The process for forming the layered gate dielectric structure includes plasma enhanced chemical vapor deposition of a structurally deficient nitride film and an annealing process which converts the originally deposited film to either an oxynitride film or a stoichiometric nitride film.

28 Claims, 3 Drawing Sheets

PROCESS FOR FORMING A PLASMA NITRIDE FILM SUITABLE FOR GATE DIELECTRIC APPLICATION IN SUB-0.25 μM TECHNOLOGIES

RELATED APPLICATION

This application claims priority of U.S. Provisional Application, Ser. No. 60/116,042 entitled A PLASMA NITRIDE PROCESS SUITABLE FOR GATE DIELECTRIC APPLICATION IN SUB-0,25 μm TECHNOLOGIES, filed Jan. 14, 1999.

This invention relates to semiconductor integrated circuit devices, most generally, and the processes for forming these devices. More specifically, this invention relates to the materials, processes, and structures used to form a layered gate dielectric film including a plasma nitride film which suppress boron penetration from a p$^+$ doped polysilicon structure through gate areas and into channel areas.

BACKGROUND OF THE INVENTION

Semiconductor integrated circuit devices include a thin dielectric material, commonly a thermally grown oxide, which functions as a gate dielectric for transistors incorporated into semiconductor integrated circuit devices. The gate dielectric material is typically formed on a semiconductor substrate over a region which will serve as a channel region. The transistors function when a channel is formed in the semiconductor substrate beneath the gate dielectric in response to a voltage being applied to a gate electrode formed atop the gate dielectric film. The quality and integrity of the gate dielectric film is critical to the functionality and lifetime of the transistor devices, which include a very tightly defined set of operational characteristics which are very sensitive to the materials and methods used to form the transistor devices. It is important, therefore, to suppress the migration of any undesired dopant species into the gate dielectric film, or through the gate dielectric film and into the subjacent channel region.

Polycrystalline silicon films are commonly used as gate electrode materials for transistors in semiconductor integrated circuits. Polycrystalline silicon may be "n-type" polycrystalline silicon or "p-type" polycrystalline silicon. By "p-type" polysilicon material, it is meant that a p-type dopant impurity is introduced into the polycrystalline silicon film. A commonly used, and preferred p-type dopant within the semiconductor industry is boron. When boron is used as an impurity dopant within a polycrystalline silicon film, it is of critical significance to maintain the boron within the polycrystalline silicon film, and especially to suppress migration of the boron into or through the gate dielectric film which forms part of the transistor.

In addition to boron diffusing into the gate dielectric material, the boron can further diffuse through the gate dielectric material and into the channel region of the transistor formed below the gate dielectric region. When boron diffuses into the gate dielectric or the channel region, gate dielectric reliability is degraded and device functionality can be destroyed. It is thus of increased significance to suppress the diffusion of boron from the polysilicon interconnect and gate structures and into and through the gate dielectric films. Boron diffusion occurs during activation processes which utilize temperatures in the range of 1000° C. to 1050° C. to activate the Boron, and also during the operation of the completed device. It is therefore desirable to have a built-in means within the gate electrode/gate dielectric structure which will suppress boron diffusion out of p-type polycrystalline silicon and into or through the gate dielectric material.

One approach to suppressing boron diffusion as above, is to utilize a layered gate dielectric film which includes both an oxide film and a nitride film. An alternate, but similar approach utilizes an oxide film, a nitride film, and a second oxide film. The combination of an oxide and a completely formed nitride film to form a gate dielectric may successfully suppress boron penetration from p-type polysilicon into the underlying channel region. In addition, the combination of an oxide and a nitride film to form a gate dielectric also reduces current leakage. However, gate structures which include a silicon nitride layer typically introduce charge trapping problems and channel mobility degradation, as well as drive current reduction. Charge trapping problems lead to hot carrier aging effects. Additionally, structurally formed silicon nitride films exert a high film stress on the substrate upon which they are formed. This is quite undesirable and can produce dislocations in the crystal lattice which forms the semiconductor substrate, which lead to drive current reduction and junction leakage.

In today's rapidly advancing semiconductor device manufacturing industry, features of the components which form semiconductor integrated circuits, continue to shrink Consistent with this trend, transistors of increasingly smaller dimensions are being produced. Accordingly, thinner gate dielectric films are necessary. In order to maintain desired electrical operational characteristics of these transistors, a silicon nitride film on the order of 10–50 angstroms would be required for use as part of the layered gate dielectric structures referred to above.

Using currently available methods for forming a structurally correct silicon nitride film, it is difficult to produce such a film having a thickness on the order of 10–50 angstroms. When a nitride film having a thickness within this range is produced according to conventional methods, the film may include pinholes, or small voids. As such, some transistors may have a gate dielectric including pinholes while others may be pinhole-free. Pinholes cause current leakage when a transistor having pinholes is biased using a voltage calculated for a transistor having a pinhole-free nitride film. In addition to pinholes, silicon nitride films formed using currently available methods, include trap sites which can trap charges and degrade the integrity of the film. These trap sites cannot be annealed out using conventional processing technology.

FIG. 2 is a cross-sectional view showing the shortcomings of conventional attempts to introduce a structurally sound silicon nitride film over the gate oxide film to form a layered gate dielectric structure. Conventional silicon nitride film 10 is formed on top surface 6 of oxide film 5 using conventional methods such as chemical vapor deposition (CVD) means, or other furnace operations as standard in the semiconductor processing industry. Using conventional means for forming the silicon nitride film 10 on the substrate, the formed silicon nitride film 10 is a structurally sound silicon nitride film. By structurally sound, it is meant that the silicon nitride film is formed according to the proper stoichiometric ratio of silicon and nitrogen. That is, three atoms of silicon and four atoms of nitrogen combine to form a silicon nitride film represented by the formula $Si_3N_4$. In order to meet the challenging demands of today's semiconductor processing industry, the thickness 11 of silicon nitride film 10 will desirably be on the order of 10 to 50 angstroms in order to accommodate the electrical characteristics sought to be achieved in the transistors which will use this layered gate dielectric structure.

When silicon nitride film 10 is formed using conventional methods, a high film stress is exerted by the deposited film upon the substrate. High film stress exerted on substrates such as silicon wafers commonly used in the semiconductor manufacturing industry, can result in dislocations in the substrate, which lead to drive current reduction and junction leakage. Additionally, conventionally formed silicon nitride film 10 introduces charge trapping problems, as well as mobility and drive current problems.

Moreover, when the thickness 11 of a silicon nitride film 10 formed using conventional methods is less than 50 angstroms, pinholes 13 invariably occur within the silicon nitride film 10. When these pinholes 13 are produced over channel region 4 and within gate area 7, the electrical characteristics and reliability of the transistors subsequently formed in gate area 7, will be compromised. Generally speaking, a high leakage will occur within the transistor, as the transistor will be biased based upon the assumption that silicon nitride film 10 is present and continuous within gate region 7. When the transistor device is biased accordingly, leakage occurs at the sites of the pinholes. When current leakage occurs in the transistor area as described above, device functionality can be destroyed.

Furthermore, silicon nitride film 10 formed using conventional methods, includes trap sites 12 which may be broken or dangling bonds or other undesired impurities. These trap sites 12 cannot be annealed out using conventional processing. As such, they remain and can trap charges introduced by hot carriers during subsequent processing operations or during device operation. The trapped charges alter the gate dielectric characteristics and can destroy device functionality. It can be therefore understood that conventionally formed nitride films, or conventionally formed nitride films in conjunction with oxide films, present shortcomings rendering them undesirable as gate dielectric materials.

Another approach for adding a nitrogen component to a gate dielectric film to suppress boron diffusion without utilizing a fully formed silicon nitride film is to disperse nitrogen throughout a gate oxide film. This approach alleviates channel mobility, drive current and charge trapping problems but does not completely correct for them. Processing techniques used to achieve this result, however, are difficult to control, unreliable and non-repeatable.

The present invention provides a layered gate dielectric structure and method for forming the same, which addresses the shortcomings of the conventional art and provides a nitride or oxynitride film which suppresses boron diffusion and is pinhole-free and trap site-free, even when formed of thicknesses on the order of 10 to 50 angstroms.

Because of the above problems associated with boron diffusion, and the shortcomings of the contemporary attempts to suppress this diffusion by adding a nitride film into the gate material, there is a demonstrated need in the art to provide a process and structure which suppresses boron penetration from heavily doped p-type polysilicon through the gate dielectric and into channel areas without introducing the above problems, and while simultaneously improving gate oxide wear out and hot carrier aging characteristics.

SUMMARY OF THE INVENTION

To achieve these and other objects, and in view of its proposes, the present invention addresses the shortcomings of the conventional attempts to suppress boron penetration and to provide a pinhole-free and trap site-free nitride film suitable for gate dielectric application. The present invention provides a process for depositing a nitride film including silicon and nitrogen, and formed by plasma deposition means as part of a layered gate dielectric film. The plasma-nitride film is structurally defective as deposited. By structurally defective, it is meant that the plasma-nitride film does not comprise only silicon and nitrogen combined according to the proper stoichiometric ratio of 3:4 (silicon:nitrogen) to form a silicon nitride film represented as $Si_3N_4$. The structurally defective film may additionally include other constituents as originally formed. The layered gate dielectric film also includes at least one oxide film.

This structurally defective nitride film is subsequently annealed to form either a structurally correct, stoichiometric silicon nitride ($Si_3N_4$) film or a silicon oxynitride film, each of which suppresses the diffusion of boron from $p^+$ polysilicon (heavily doped p-type polysilicon), and through a dielectric gate and into the channel area. Additionally, the layered gate dielectric film including the plasma nitride film enhances gate oxide integrity and improves gate oxide wear out characteristics and hot carrier aging behavior by significantly reducing or eliminating the trap sites present in the dielectric structure, during the anneal process. The process of the present invention produces a nitride gate dielectric film which is resistant to the charge trapping, drive current, channel mobility and film stress problems associated with a nitride gate dielectric film formed using conventional processes. The present invention finds application in any transistor formed in CMOS and bi-CMOS technologies, including sub-0.25 $\mu$m technologies.

DETAILED DESCRIPTION OF THE INVENTION

I. Gate Dielectric Structure, Generally

Figure 1:
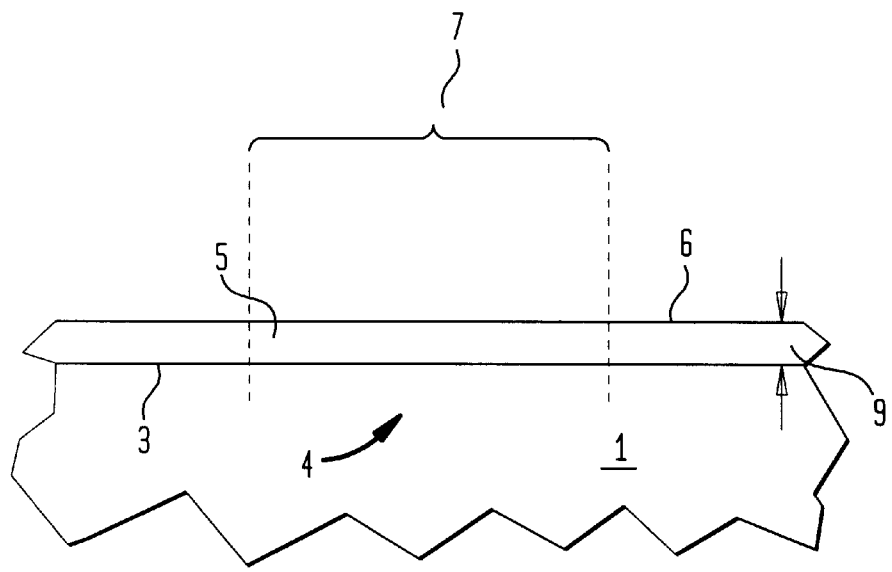
FIG. 1 is a cross-section showing a gate oxide film as in the prior art.
Figure 2:
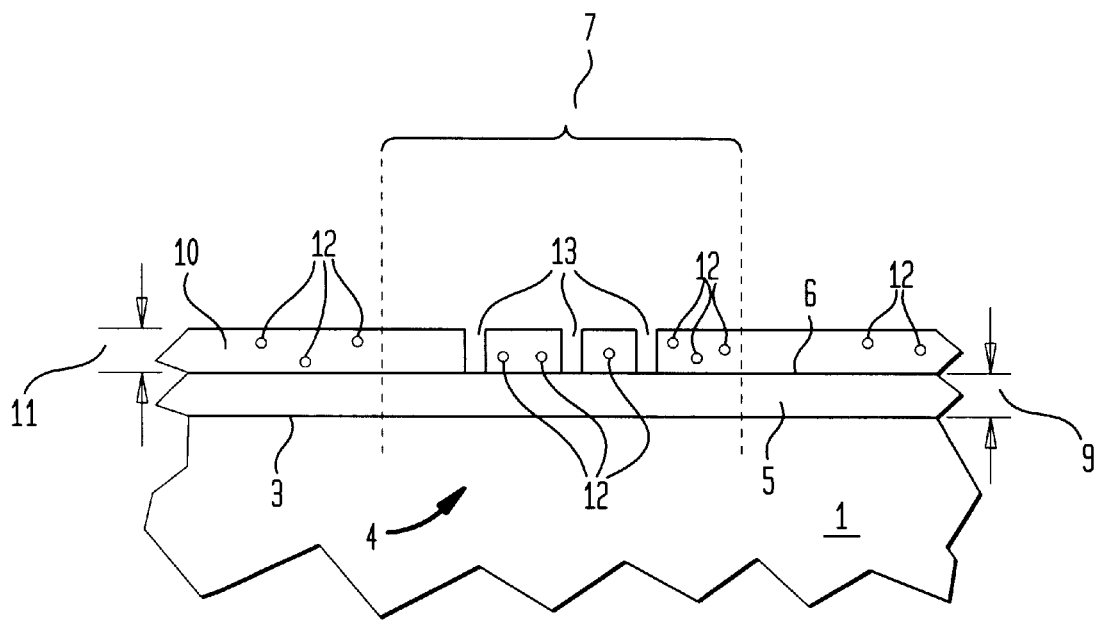
FIG. 2 is a cross-section showing a silicon nitride film having pinholes as in the prior art.

The present invention offers several advantages over the conventional methods for forming a suitably thin silicon nitride film as part of a layered gate dielectric structure. FIG. 1 is a cross-sectional view showing a conventional oxide film formed on the substrate to be used as a gate dielectric material in a semiconductor device such as a transistor. In FIG. 1, oxide film 5 is shown formed on top surface 3 of semiconductor substrate 1. In the preferred embodiment, semiconductor substrate 1 may be a silicon wafer commonly used in the semiconductor manufacturing industry. In the preferred embodiment, oxide film 5 may be formed by thermally oxidizing semiconductor substrate 1 to form a silicon dioxide (hereinafter "oxide" ) film on the surface. In an alternate embodiment, oxide film 5 may be formed by other means such as by chemical vapor deposition means. Oxide film 5 includes a top surface 6 and a thickness 9 which may conventionally be on the order of 5–250 angstroms. Oxide film 5 is formed to serve as a gate dielectric material for a transistor device to be subsequently formed within semiconductor substrate 1. Oxide film 5 is formed within region 7 which will function as a gate region of a transistor to be formed subsequently (not shown). As such, it can be said that oxide film 5 is formed over channel region 4 disposed within semiconductor substrate 1.

II. Detailed Description of the Preferred Embodiments of the Invention

A) Exemplary Embodiment #1

Figure 3A:
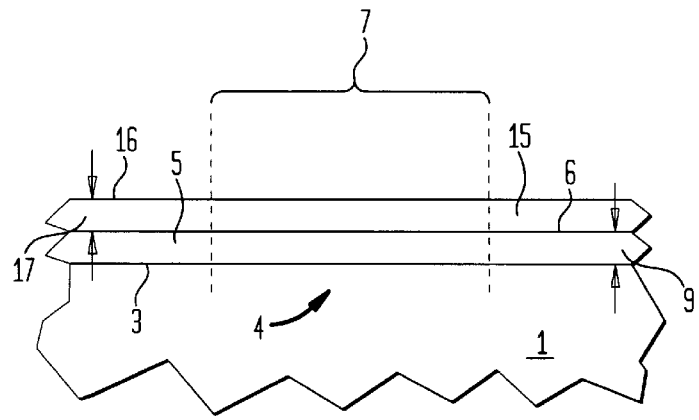
FIG. 3A is a cross-section showing the subsequent step in the processing sequence which follows from FIG. 1, and includes a silicon rich-plasma nitride film formed over the gate oxide film.
Figure 3B:
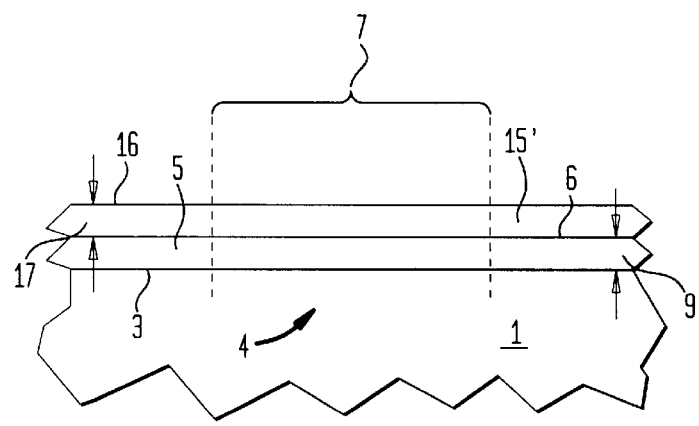
FIG. 3B is a cross-section showing the silicon rich-plasma nitride film converted to a silicon oxynitride film.
Figure 3C:
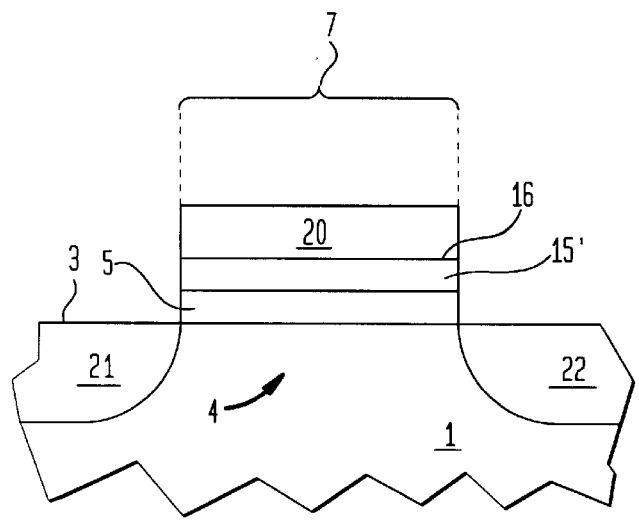
FIG. 3C is a cross-section showing a transistor formed according to one exemplary embodiment of the present invention.

FIG. 3A is a cross-sectional view representing the first step in the processing sequence which follows from the conventional gate dielectric film structure shown in FIG. 1. FIGS. 3A through 3C show a sequence of processing operations used to form an exemplary embodiment of the present invention.

In FIG. 3A, structurally defective plasma nitride film 15 is formed over top surface 6 of gate oxide film 5. Gate oxide film 5 and substrate 1 are as described in conjunction with FIG. 1. Structurally defective plasma nitride film 15 is included within region 7 which will form the gate region of a subseqentially formed transistor device. As such, structurally defective plasma nitride film 15 is included as a portion of a layered gate dielectric film structure. Structurally defective nitride film 15 includes thickness 17 and top surface 16. In the preferred embodiment, thickness 17 may be on the order of 10–50 angstroms. In alternate embodiments, different film thicknesses may be used. Structurally defective silicon nitride film 15 contains silicon in excess of the stoichiometric ratio of three parts silicon to four parts nitrogen as in the stoichiometrically formed, structurally sound film represented as silicon nitride, or $Si_3N_4$. Film 15 is formed using plasma enhanced chemical vapor deposition (PECVD) means. The range of processing parameters as well as the preferred value of processing parameters used to form silicon rich, structurally defective plasma nitride film 15, appear in Table 1.

TABLE 1

Formation of Si-Rich Nitride Film

| Parameters | Range | Preferred Value |
| --- | --- | --- |
| Deposition temperature | 250° C.–550° C. | 480° C. |
| Plasma power (13.56 MHz) | 10 watts–500 watts | 65 watts |
| Plasma power (200 kHz) | 5 watts–500 watts | 40 watts |
| Pressure | 1 mTorr–500 Torr | 3 Torr |
| SiH4 (or SiH$_2$Cl$_2$) gas flow | 1 sccm–500 sccm | 50 sccm |
| NH3 gas flow | 1 sccm–500 sccm | 10 sccm |
| N2 gas flow | 100 sccm–2000 sccm | 1000 sccm |
| Ar gas flow | 100 sccm–2000 sccm | 500 sccm |

It can be seen that silicon rich, structurally defective film 15 is pinhole-free as foamed. It is an aspect of the present invention that a PECVD process is used with the parameters indicated in Table 1, to produce a film 15 which is pinhole-free, which has a reduced film stress, and which is structurally defective by including an excess of silicon which may be subsequently oxidized.

Now turning to FIG. 3B, silicon rich plasma nitride film 15 of FIG. 3A, is converted to silicon oxynitride ($Si_xO_yN_z$) film 15' by means of an annealing process. Silicon oxynitride may be represented as $Si_xO_yN_z$ with the values of x, y, and z not being fixed. Silicon oxynitride film 15 may, therefore, include molecules of silicon nitride ($Si_3N_4$) within the film. Film thickness 17 remains virtually unchanged during the conversion of silicon rich film 15 to silicon oxynitride film 15'. The film conversion process is an annealing process which may be carried out using furnace processing or rapid thermal annealing techniques. Table 2 shows the range and the preferred values for processing parameters used in the rapid thermal annealing process. Table 3 shows the range and preferred parameter values for the furnace annealing process.

TABLE 2

Rapid Thermal Anneal

| Parameters | Range | Preferred Value |
| --- | --- | --- |
| Oxidation temperature | 750° C.–1000° C. | 900° C. |
| Pressure | 1 Torr–760 Torr | 760 Torr |
| O$_2$ gas flow | 1 sccm–500 sccm | 10 sccm |
| N$_2$ gas flow | 100 sccm–5000 sccm | 2000 sccm |
| Time | 1 sec.–3 min. | 30 sec. |

TABLE 3

Furnace Anneal

| Parameters | Range | Preferred Value |
| --- | --- | --- |
| Oxidation temperature | 750° C.–1000° C. | 800° C. |
| Pressure | 1 Torr–760 Torr | 760 Torr |
| O$_2$ gas flow | 1 sccm–500 sccm | 10 sccm |
| N$_2$ gas flow | 100 sccm–5000 sccm | 2000 sccm |
| Time | 1 min.–30 min. | 5 min. |

In each of the rapid thermal annealing process, and the furnace process, oxygen is present as an annealing gas. The oxygen present during the high temperature anneal, oxidizes the excess silicon within the originally formed silicon rich plasma nitride film 15 of FIG. 3A, and thereby converts silicon rich, structurally defective nitride film 15 of FIG. 3A, to silicon oxynitride film 15' of FIG. 3B. Because of the nature of the film as formed, and due to the annealing process used, the converted silicon oxynitride film 15' maintains the pinhole-free character of the originally deposited silicon rich film (15 as in FIG. 3A).

Silicon oxynitride film 15' further contains a significantly reduced number of trap sites compared to conventional films, because of the PECVD process used to form the original, structurally deficient, silicon rich film 15, and because of the annealing process. The annealing process provides for oxygen to diffuse into the originally deposited film and reconstruct the film, eliminating any dangling or defective bonds which may have existed to form trap sites in the originally formed film (film 15 as in FIG. 3A). As such, silicon oxynitride film 15' consists of a continuously bonded material, essentially free of trap sites. In an exemplary embodiment, all trap sites are eliminated by the annealing process. Silicon oxynitride film 15' provides resistance to boron diffusion. Silicon oxynitride film 15', similar to its predecessor-silicon rich film 15 as in FIG. 3A, does not exert a high film stress upon the substrate, which may cause dislocations within substrate 1. FIG. 3B shows that oxynitride film 15' is free of trap sites after annealing. Analytical techniques such as Electron Spin Resonance techniques may be used to confirm that the film is free of trap sites.

FIG. 3C is a cross-section showing a transistor formed according to the first exemplary embodiment of the present invention. The transistor includes oxide film 5 and silicon oxynitride film 15' as described previously. The structure further includes a gate electrode film 20 disposed over top surface 16 of silicon oxynitride film 15'. It can be seen that the layered gate dielectric films 5 and 15' as well as the gate electrode 20 remain only in gate region 7. In the preferred embodiment, the film which forms gate electrode 20 may comprise polycrystalline silicon. In the preferred embodiment, the film which forms gate electrode 20 may be formed using chemical vapor deposition methods, but other films and methods of formation may be used in the alternative. Also in the preferred embodiment, gate electrode 20 may be doped using a boron dopant impurity. The boron dopant impurity lowers sheet resistance and offers other advantageous electrical qualities to the film used to form gate electrode 20. With the addition of the boron dopant impurity, the gate electrode 20 enjoys the advantages offered by the presence of a boron dopant, without the associated disadvantage of uncontrolled boron dopant out-diffusion. The layered gate dielectric structure of the present invention affords this advantage as it suppresses boron dopant diffusion into and below the gate dielectric film.

According to the preferred method of formation, gate electrode film 20 may be formed continuously over top surface 16 shown in FIG. 3B. The stack of continuous films 20, 15', and 5 may be formed into a discrete electrode over the layered gate dielectric films in gate region 7 by patterning and etching. One exemplary conventional method includes forming a photosensitive film (not shown) over the stack of continuous films, forming a pattern in the photosensitive film within gate region 7, then sequentially removing the exposed portions of films 20, 15', and 5. Conventional means, such as plasma etching or wet etching, may be used and are common in the art. After the films are removed, thus exposing surface 3 of substrate 1, source and drain regions 21 and 22 may be formed using the stacked gate film structure of the transistor as a mask, and using ion implantation and/or diffusion means to form source drain regions 21 and 22 within surface 3 of semiconductor substrate 1.

The completed transistor device includes gate electrode 20 disposed over the layered gate dielectric films formed in gate region 7 and over channel region 4. In the preferred embodiment, gate electrode film 20 includes boron dopant impurities. The layered gate dielectric films include oxide film 5 and silicon oxynitride film 15'. The silicon oxynitride film 15' is essentially pinhole-free and void of trap sites. The layered gate dielectric structure suppresses boron penetration through the film and into the underlying substrate 1. Additionally, the layered gate dielectric structure does not introduce current mobility and drive current problems to the same extent that a layered gate dielectric structure including a conventionally formed silicon nitride film does. Furthermore, the layered gate dielectric film formed according to the process of the present invention, does not introduce the charge trapping problems associated with conventionally nitrided oxides. As such, the layered gate dielectric structure of the first exemplary embodiment, as shown in FIG. 3C, is robust against plasma damage, and hot carrier effects.

B) Exemplary Embodiment #2

Figure 4A:
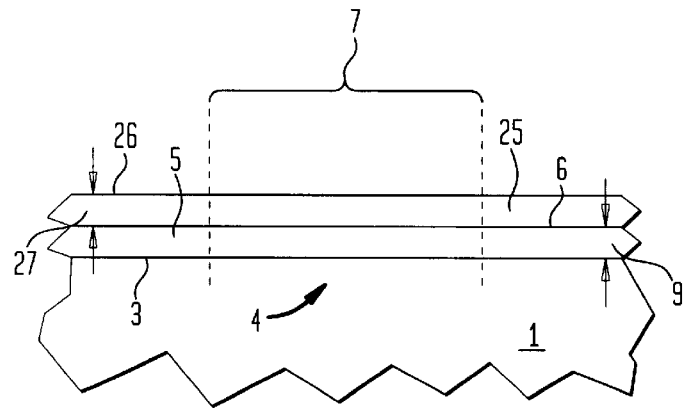
FIG. 4A is a cross-section showing the subsequent step in the processing sequence which follows from FIG. 1, and includes an $Si_xH_yN_z$ film formed over the gate oxide film.
Figure 4B:
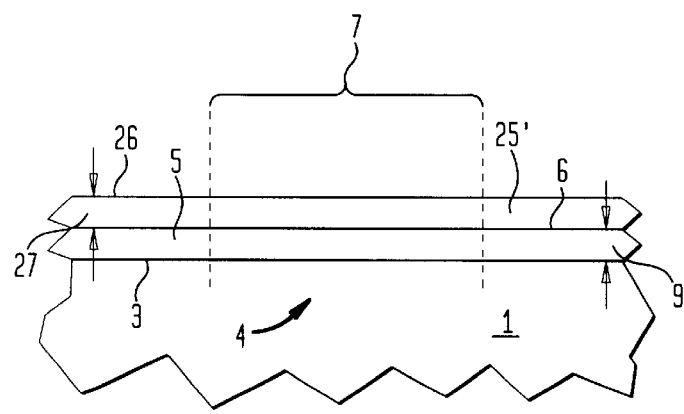
FIG. 4B is a cross-section showing the $Si_xH_yN_z$ film converted to a structurally sound silicon nitride film.
Figure 4C:
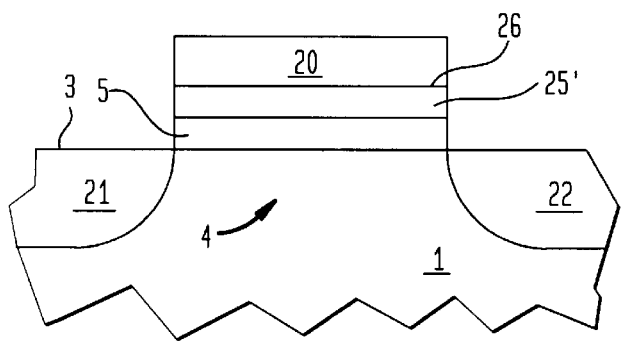
FIG. 4C is a cross-section showing a transistor formed according to a second exemplary embodiment of the present invention.

FIG. 4A is a cross-sectional view representing the first step in the processing sequence which follows from the gate dielectric film structure shown in FIG. 1. FIGS. 4A through 4C show a sequence of processing operations used to form another exemplary embodiment of the present invention.

In FIG. 4A, structurally defective plasma nitride film 25 is formed over top surface 6 of gate oxide film 5. Gate oxide film 5 is as described in conjunction with FIG. 1. Structurally defective plasma nitride film 25 is included within region 7 which will form the gate region of a subsequently formed transistor device. As such, structurally defective plasma nitride film 25 is adapted to form a portion of a layered gate dielectric film structure. Structurally defective plasma nitride film 25 includes thickness 27 and top surface 26. In the preferred embodiment, thickness 27 may be on the order of 10 to 50 angstroms. In alternate embodiments, different film thicknesses may be used. Structurally defective nitride film 25 includes hydrogen, silicon, and nitrogen. The elements are not combined according to a stoichiometric ratio. As such, the film may be represented by $Si_xH_yN_z$, with the values of x, y, and z not being fixed. Structurally defective nitride film 25 is formed using plasma-enhanced chemical vapor deposition (PECVD) means. The range of processing parameters as well as the preferred value of processing parameters used to form hydrogen-containing, structurally defective nitride film 25, appear in Table 4.

TABLE 4

Formation of $Si_xH_yN_z$ Film

| Parameters | Range | Preferred Value |
| --- | --- | --- |
| Deposition temperature | 250° C.–550° C. | 480° C. |
| Plasma power (13.56 MHZ) | 10 watts–500 watts | 65 watts |
| Plasma power (200 kHz) | 5 watts–500 watts | 40 watts |
| Pressure | 1 mTorr–500 Torr | 3 Torr |
| SiH4 gas flow | 1 sccm–500 sccm | 10 sccm |
| NH3 gas flow | 1 sccm–500 sccm | 50 sccm |
| N2 gas flow | 100 sccm–2000 sccm | 1000 sccm |
| Ar gas flow | 100 sccm–2000 sccm | 500 sccm |

It can be seen that the PECVD process according to Table 4 is a hydrogen-rich process in comparison to the PECVD process used to form silicon rich film 15 as in FIG. 3A, and according to Table 1. Specifically, the ammonia ($NH_3$) gas flow is increased, and silane ($SiH_4$) is necessarily used as the silicon source. It can be seen that hydrogen-containing structurally defective plasma nitride film 25 is pinhole-free as formed. It is an aspect of the present invention that a PECVD process is used with the parameters indicated in Table 4, to produce a film 25 which is pinhole-free and which has a reduced film stress compared to a silicon nitride film formed according to a stoichiometric ratio. Film 25 is structurally defective as it includes hydrogen incorporated within a film also containing silicon and nitrogen. As such, a subsequent high temperature annealing process may be used to drive the hydrogen from the film, and form a structurally proper silicon nitride—$Si_{3\ N4}$ film.

Now turning to FIG. 4B, hydrogen-containing film 25 of FIG. 4A, is converted to a silicon nitride film 25' which includes silicon and nitrogen combined in a stoichiometric ratio, by means of an annealing process. Film thickness 27 remains virtually unchanged during the conversion of the hydrogen-containing film 25 to the stoichiometric silicon nitride film 25'. The film conversion process is an annealing process which may be carried out using furnace processing or rapid thermal annealing techniques. Table 5 shows the range and the preferred values for processing parameters used in the rapid thermal annealing process. Table 6 shows the range and preferred parameter values for the furnace annealing process.

TABLE 5

Rapid Thermal Anneal

| Parameters | Range | Preferred Value |
| --- | --- | --- |
| Oxidation temperature | 750° C.–1000° C. | 900° C. |
| Pressure | 1 Torr–760 Torr | 760 Torr |
| N2 | 100 sccm–5000 sccm | 2000 sccm |
| Time | 1 sec.–3 min. | 30 sec. |

TABLE 1

Furnace Anneal

| Parameters | Range | Preferred Value |
| --- | --- | --- |
| Oxidation temperature | 750° C.–1000° C. | 800° C. |
| Pressure | 1 Torr–760 Torr | 760 Torr |
| N2 | 100 sccm–5000 sccm | 2000 sccm |
| Time | 1 min.–30 min. | 5 min. |

In each of the rapid thermal annealing process, and the furnace process, nitrogen is used as the annealing gas. The nitrogen present during the high temperature anneal drives off the hydrogen from the film and thereby converts hydrogen-containing, structurally defective plasma nitride film 25 of FIG. 4A, to silicon nitride film 25' of FIG. 4B. Because of the nature of the film as formed, and due to the annealing process used, the converted silicon nitride film 25' maintains the pinhole-free character of the originally deposited hydrogen-containing film (film 25 as in FIG. 4A). Silicon nitride film 25' further contains a significantly reduced number of trap sites, when compared to conventional films. This is due to the PECVD process used to form the original, structurally deficient film 25, and the annealing process used to convert the film. The nitrogen annealing process drives the trapped hydrogen from the originally deposited film, thereby reconstructing the film, eliminating any dangling or defective bonds which may have existed to form trap sites in the originally formed film (film 25 as in FIG. 4A). During the anneal process, hydrogen bonds are replaced by silicon-to-nitrogen bonds which form the silicon nitride structure. As such, silicon nitride film 25' consists of a continuously bonded material, essentially free of trap sites. In an exemplary embodiment, all trap sites are eliminated by the annealing process. Silicon nitride film 25' provides resistance to boron diffusion. Silicon nitride film 25', similar to its predecessor-hydrogen-containing film 25 as in FIG. 4A, does not exert a high film stress upon the substrate. FIG. 4B shows that converted silicon nitride film 25' is free of trap sites after annealing. As above, analytical techniques such as Electron Spin Resonance techniques may be used to confirm that the film is free of trap sites.

FIG. 4C shows a cross-section of a transistor formed according to the second exemplary embodiment of the present invention. The transistor includes oxide film and silicon nitride film 25' as described previously. The structure further includes a gate electrode film 20 disposed over top surface 26 of silicon nitride film 25'. The structure and formation of the embodiment shown in FIG. 4C, is almost identical to the transistor structure as shown in FIG. 3C. The two embodiments are distinguished, however, because the upper dielectric film of the two-layered gate dielectric structure shown in FIG. 4C comprises a silicon nitride film 25', whereas in FIG. 3C, the upper dielectric film of the layered dielectric film structure comprises a silicon oxynitride film 15'.

With the exception of silicon nitride film 25' which is formed according to a different process than used to form silicon oxynitride film 15' FIG. 3C, the structure of the transistor shown in FIG. 4C is identical to the transistor shown in FIG. 3C and may be formed using the same methods and materials. Additionally, the gate dielectric structure of the transistor shown in FIG. 4C offers the same advantages and features as discussed with respect to the gate dielectric structure of the transistor device as in FIG. 3C.

C) Exemplary Embodiment #3

Figure 5:
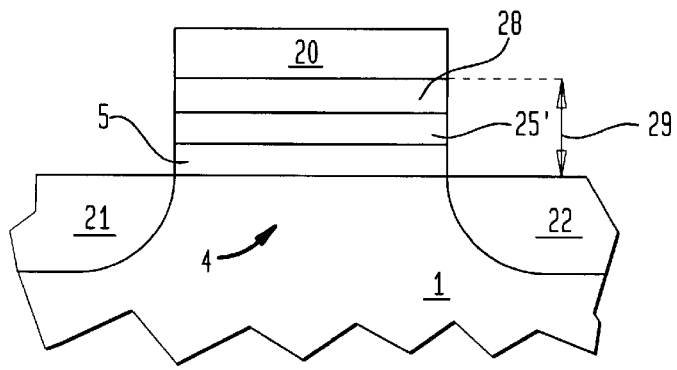
FIG. 5 is a cross-section showing a transistor with a three-layered gate dielectric film formed according to a third exemplary embodiment of the present invention.

In another exemplary embodiment, and as shown in FIG. 5, the layered gate dielectric film structure may include an additional oxide film 28 disposed over silicon nitride film 25'. In an alternative embodiment (not shown) additional oxide film 28 may be disposed over silicon oxynitride film 15' as shown and discussed with respect to FIG. 3C. In each of the embodiments, the additional oxide film is disposed between the converted film (silicon nitride film 25' as shown in FIG. 5, or silicon oxynitride film in the alternative embodiment) and gate electrode film 20. Additional oxide film 28 may be formed according to low pressure chemical vapor deposition (LPCVD), or PECVD means. In the preferred embodiment, the overall thickness 29 of the layered gate dielectric film structure will lie within the range of 50 to 250 angstroms.

D) Distinguishing Features of Each of the Embodiments

Each of the layered gate dielectric film structures of the present invention include the following advantages:

they are essentially pinhole-free they exert a reduced film stress upon the substrate in comparison to a layered dielectric film including a conventionally formed nitride film they suppress boron diffusion they provide a significantly reduced number of trap sites, and are thus more resistant to damaging plasma and hot carrier effects, in comparison to conventionally formed nitride films, and they do not introduce current mobility, drive current, and interface trap problems associated with conventionally nitrided oxides.

The preceding description merely illustrates the principles of the invention. It will thus be appreciated that those skilled in the art will be able to devise various arrangement which, although not explicitly described or shown herein, embody the principals of the invention and are included within its scope and spirit. Furthermore, all examples and conditional language recited herein are principally intended to be expressly for pedagogical purposes to aid the reader in understanding the principals of the invention and the concepts contributed by the inventors to furthering the art, and to be construed as being without limitation to such specifically recited examples and conditions.

Moreover, all statements herein reciting principles, aspects, and embodiments of invention, as well as specific examples thereof, are intended to encompass both structure and functional equivalents thereof. Additionally, it is intended that such equivalents include both currently known as well as equivalents developed in the future, i.e., any elements developed that perform the same function, regardless of structure. As such, the invention is not intended to be limited to the details shown. Rather, various modifications and additions may be made to details within the scope and range of equivalents of the claims and without departing from the invention. For example, the materials and details of the process used to form the structures described in conjunction with the exemplary embodiment, may be different. Additional details such as the processing times and conditions, may also be varied and also remain within the scope and spirit of the present invention.

Accordingly, it is intended by the appended claims to cover all such modifications and changes as far within the true spirit and scope of the invention.

What is claimed:

1. A process for forming a gate structure on a semiconductor substrate, comprising the steps of:

(a) providing a semiconductor substrate having a surface being a gate region;

(b) forming an oxide film over the gate region;

(c) depositing an original dielectric layer over the oxide film by means of plasma enhanced chemical vapor deposition, the original dielectric layer represented by $Sl_xN_y$ wherein x is greater than $0.75_y$ as deposited, the oxide film and the original dielectric layer combining to form a gate dielectric structure;

(d) forming a gate electrode film over the gate dielectric structure; and (e) annealing the structure.

2. The process as in claim 1, wherein step (b) is carried out by thermally oxidizing the surface.

3. The process as in claim 1, wherein the annealing is carried out in an environment which includes oxygen.

4. The process as in claim 1, wherein the annealing converts the original dielectric layer to a converted dielectric layer comprising silicon oxynitride.

5. The process as in claim 4, wherein the converted dielectric layer further includes $Si_3N_4$.

6. The process as in claim 1, wherein the annealing comprises rapid thermal annealing.

7. The process as in claim 1, wherein the original dielectric layer includes an excess of Si with respect to a stoichiometric ratio of $Si_3N_4$ and the annealing oxidizes the excess.

8. The process as in claim 1, wherein step (d) comprises forming a polysilicon film to be used as the gate electrode film.

9. The process as in claim 8, wherein step (d) comprises:

(1) depositing a polysilicon film over the substrate;

(2) forming a pattern in a photosensitive film disposed over the polysilicon film;

(3) removing predetermined portions of the polysilicon film from areas other than over the original dielectric layer; and (4) removing the photosensitive film from the substrate.

10. The process as in claim 9, further comprising the step of doping the polysilicon film with boron prior to the step (2) of forming a pattern.

11. The process as in claim 1, wherein step (c) includes at least one of $SiH_4$ and $SiCl_2H_2$ as a deposition gas, and at least one of $NH_3$ and $N_2$ as a further deposition gas.

12. The process as in claim 11, wherein step (c) includes $SiCl_2H_2$ and $N_2$ as deposition gases and is performed at a temperature within the range of 430° C. to 530° C.

13. The process as in claim 1, wherein step (c) includes a deposition temperature within the range of 250° C. to 550° C.

14. The process as in claim 1, wherein step (c) includes forming the original dielectric layer having a thickness less than about 50 angstroms.

15. The process in claim 1, wherein the annealing is carried out at a temperature within the range of 750° C. to 1000° C.

16. A process for forming a gate structure on a semiconductor substrate, comprising the steps of:

(a) providing a semiconductor substrate having a surface being a gate region;

(b) forming an oxide film over the gate region;

(c) depositing an original dielectric layer over the oxide film by means of plasma enhanced chemical vapor deposition, the original dielectric layer including silicon, hydrogen, and nitrogen in a non-stoichiometric ratio, the oxide film and the original dielectric layer combining to form a gate dielectric structure;

(d) forming a gate electrode film over the date dielectric structure; and (e) annealing the structure.

17. The process as in claim 16, wherein step (b) is carried out by thermally oxidizing the surface.

18. The process as in claim 16, wherein the annealing is carried out in a nitrogen environment at a temperature within the range of 750° C. to 1000° C.

19. The process as in claim 16, wherein the annealing drives off the hydrogen from the original dielectric layer.

20. The process as in claim 16, wherein the annealing essentially converts the original dielectric layer to a silicon nitride ($Si_3N_4$) layer.

21. The process as in claim 16, wherein the annealing comprises rapid thermal annealing.

22. The process as in claim 16, wherein step (d) comprises forming a polysilicon film to be used as the gate electrode film.

23. The process as in claim 22, further comprising doping the polysilicon film with boron.

24. The process as in claim 16, wherein step (c) includes at least $SiH_4$ and $NH_3$ as deposition gasses.

25. The process as in claim 16, wherein step (c) includes a deposition temperature within the range of 250° C. to 550° C.

26. The process as in claim 16, wherein step (c) includes forming the original dielectric layer having a thickness less than about 50 angstroms.

27. The process as in claim 1, further comprising the step (c1) of forming a further dielectric film over the original dielectric layer.

28. The process as in claim 16, further comprising the step (c1) of forming a further dielectric film over the original dielectric layer.

* * * * *